United States Patent
Noguchi et al.

(10) Patent No.: US 7,717,546 B2
(45) Date of Patent: May 18, 2010

(54) PIEZOELECTRIC DEVICE AND LIQUID JET HEAD

(75) Inventors: Motohisa Noguchi, Suwa (JP); Koji Sumi, Shiojiri (JP); Motoki Takabe, Shiojiri (JP); Naoto Yokoyama, Suwa (JP)

(73) Assignee: Seiko Epson Corporation (JP)

(*) Notice: Subject to any disclaimer, the term of this patent is extended or adjusted under 35 U.S.C. 154(b) by 477 days.

(21) Appl. No.: 11/879,628

(22) Filed: Jul. 18, 2007

(65) Prior Publication Data

US 2008/0018716 A1 Jan. 24, 2008

(30) Foreign Application Priority Data

Jul. 19, 2006 (JP) .............................. 2006-197091

(51) Int. Cl.
*B41J 2/045* (2006.01)
(52) U.S. Cl. ...................................................... 347/71
(58) Field of Classification Search ............. 347/68–72; 400/124.14–124.16; 310/363–366
See application file for complete search history.

(56) References Cited

U.S. PATENT DOCUMENTS

| 6,478,412 B1* | 11/2002 | Hanabata ...................... 347/71 |
| 7,101,026 B2* | 9/2006 | Shimada et al. ................ 347/71 |
| 2002/0126185 A1* | 9/2002 | Murai .......................... 347/68 |

FOREIGN PATENT DOCUMENTS

| JP | 2001-088294 | 4/2001 |
| JP | 2006-093312 | 4/2006 |
| JP | 2006-245141 | 9/2006 |
| JP | 2007-250626 | 9/2007 |

OTHER PUBLICATIONS

Seung-Eek Park, et al., "Ultrahigh Strain and Piezoelectric Behavior in Relaxor Based Ferroelectric Single Crystals", J. Appl. Phys. 82(4), 1804-1811 (1997).

* cited by examiner

*Primary Examiner*—K. Feggins
(74) *Attorney, Agent, or Firm*—Harness, Dickey & Pierce, P.L.C.

(57) ABSTRACT

A piezoelectric device including: a substrate; a lower electrode formed over the substrate; a piezoelectric layer formed over the lower electrode and including lead zirconate titanate; and an upper electrode formed over the piezoelectric layer, the lead zirconate titanate having a half-width of a peak of a (100) plane measured by an X-ray diffraction rocking curve method of 10 degrees or more and 25 degrees or less.

5 Claims, 1 Drawing Sheet

PIEZOELECTRIC DEVICE AND LIQUID JET HEAD

Japanese Patent Application No. 2006-197091, filed on Jul. 19, 2006, is hereby incorporated by reference in its entirety.

BACKGROUND OF THE INVENTION

The present invention relates to a piezoelectric device and a liquid jet head.

A piezoelectric device used for a liquid jet head or the like includes a piezoelectric layer. A typical material for the piezoelectric layer is lead zirconate titanate ($Pb(Zr,Ti)O_3$: PZT) or the like. For example, S. E. Park and T. R. Shrout, J. Appl. Phys., 82 (4), 1804 (1997) discloses that piezoelectric characteristics differ to a large extent depending on the electric field application direction with respect to the polarization axis of a PZT crystal. In a piezoelectric device having a stacked structure in which a piezoelectric layer is placed between a lower electrode and an upper electrode, since the electric field application direction is constant, piezoelectric characteristics may vary to a large extent depending on the orientation state of the crystal forming the piezoelectric layer.

SUMMARY

According to a first aspect of the invention, there is provided a piezoelectric device comprising:

a substrate;

a lower electrode formed over the substrate;

a piezoelectric layer formed over the lower electrode and including lead zirconate titanate; and an upper electrode formed over the piezoelectric layer, the lead zirconate titanate having a half-width of a peak of a (100) plane measured by an X-ray diffraction rocking curve method of 10 degrees or more and 25 degrees or less.

According to a second aspect of the invention, there is provided a liquid jet head comprising:

a nozzle plate having a nozzle hole;

a substrate formed over the nozzle plate and having a pressure generation chamber which communicates with the nozzle hole;

an elastic section formed over the substrate;

a lower electrode formed over the elastic section;

a piezoelectric layer formed over the lower electrode and including lead zirconate titanate; and an upper electrode formed over the piezoelectric layer, the lead zirconate titanate having a half-width of a peak of a (100) plane measured by an X-ray diffraction rocking curve method of 10 degrees or more and 25 degrees or less.

DETAILED DESCRIPTION OF THE EMBODIMENT

Figure 1:
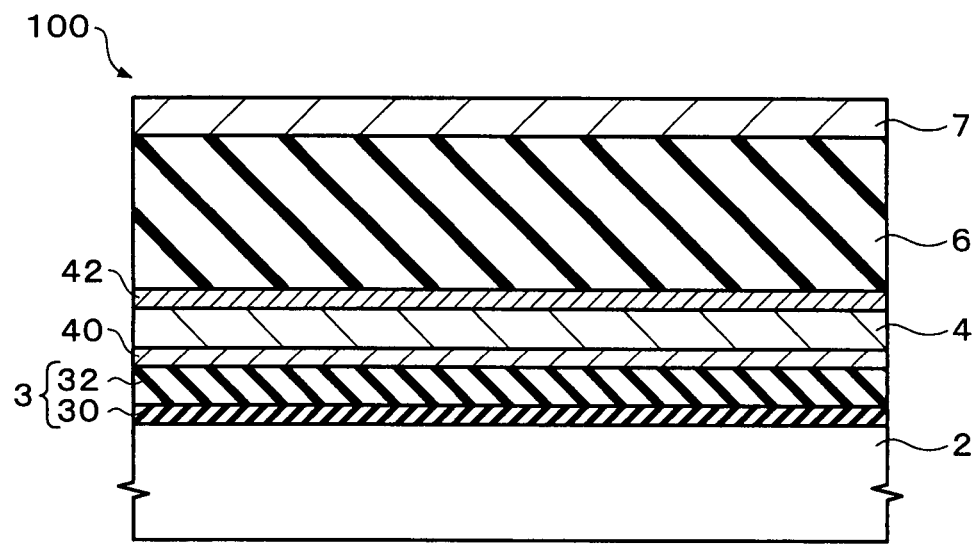
FIG. 1 is a cross-sectional view showing a piezoelectric device according to one embodiment of the invention.

The invention may provide a highly reliable piezoelectric device and liquid jet head.

According to one embodiment of the invention, there is provided a piezoelectric device comprising:

a substrate;

a lower electrode formed over the substrate;

a piezoelectric layer formed over the lower electrode and including lead zirconate titanate; and an upper electrode formed over the piezoelectric layer, the lead zirconate titanate having a half-width of a peak of a (100) plane measured by an X-ray diffraction rocking curve method of 10 degrees or more and 25 degrees or less.

In this piezoelectric device, the half-width of the peak of the (100) plane of the lead zirconate titanate measured by the X-ray diffraction rocking curve method is 10 degrees or more and 25 degrees or less. This suppresses the effects on piezoelectric characteristics due to a variation in crystal orientation of the lead zirconate titanate accompanying a change in environment and process conditions. This has been confirmed by the experimental example described later. Therefore, this embodiment can provide a piezoelectric device having uniform piezoelectric characteristics and high reliability.

In the piezoelectric device according to this embodiment, the half-width may be 19 degrees or more and 21 degrees or less.

In the piezoelectric device according to this embodiment, a sum of a degree of (110) orientation and a degree of (111) orientation of the lead zirconate titanate measured by an X-ray diffraction theta-2 theta method may be 3% or more and 50% or less.

According to one embodiment of the invention, there is provided a liquid jet head comprising:

a nozzle plate having a nozzle hole;

a substrate formed over the nozzle plate and having a pressure generation chamber which communicates with the nozzle hole;

an elastic section formed over the substrate;

a lower electrode formed over the elastic section;

a piezoelectric layer formed over the lower electrode and including lead zirconate titanate; and an upper electrode formed over the piezoelectric layer, the lead zirconate titanate having a half-width of a peak of a (100) plane measured by an X-ray diffraction rocking curve method of 10 degrees or more and 25 degrees or less.

A method of manufacturing a piezoelectric device according to one embodiment of the invention comprises:

forming a lower electrode formed over a substrate;

forming a piezoelectric layer including lead zirconate titanate over the lower electrode;

forming an upper electrode formed over the piezoelectric layer; and subjecting the piezoelectric layer to measurement by an X-ray diffraction rocking curve method, and determining a piezoelectric layer of which the lead zirconate titanate has a half-width of a peak of a (100) plane of 10 degrees or more and 25 degrees or less to be a nondefective product.

In the method of manufacturing a piezoelectric device according to this embodiment, a piezoelectric layer of which the half-width is 19 degrees or more and 21 degrees or less may be determined to be a nondefective product.

The method of manufacturing a piezoelectric device according to this embodiment may include subjecting the piezoelectric layer to measurement by an X-ray diffraction theta-2 theta method, and determining a piezoelectric layer of which the lead zirconate titanate has a sum of a degree of (110) orientation and a degree of (111) orientation of 3% or more and 50% or less to be a nondefective product.

Some embodiments of the invention are described below with reference to the drawings.

Figure 2:
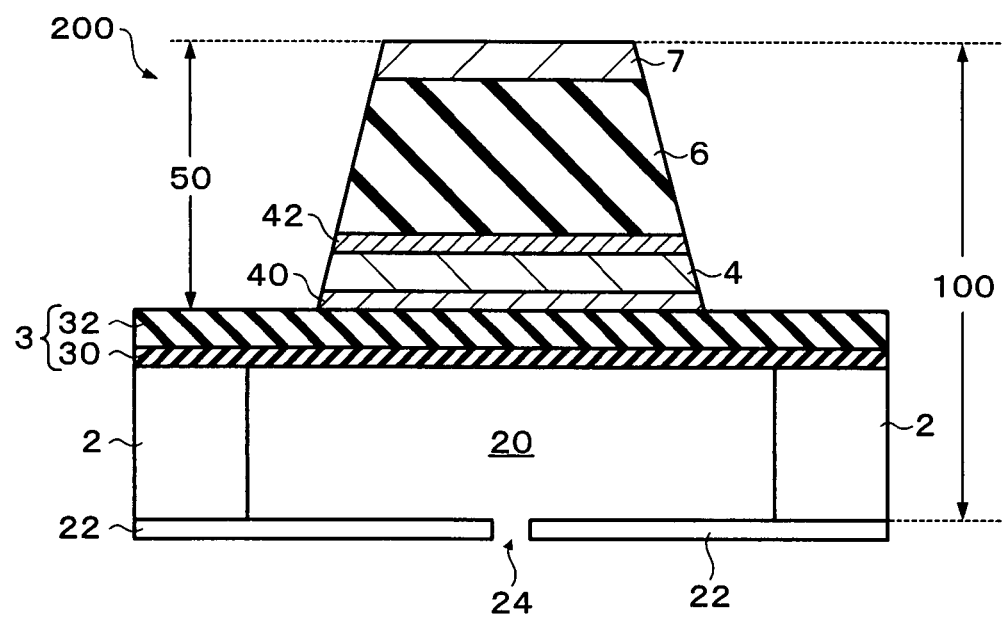
FIG. 2 is a cross-sectional view schematically showing a liquid jet head according to one embodiment of the invention.

A piezoelectric device 100 and a liquid jet head 200 according to one embodiment of the invention are described below. FIG. 1 is a cross-sectional view schematically showing an example of the piezoelectric device 100, and FIG. 2 is a cross-sectional view schematically showing an example of the liquid jet head 200.

As shown in FIG. 1, the piezoelectric device 100 includes at least a substrate 2, a lower electrode 4, a piezoelectric layer 6, and an upper electrode 7. The piezoelectric device 100 may also include an elastic section 3, an adhesive layer 5, and a buffer layer 42. As shown in FIG. 2, the liquid jet head 200 includes the piezoelectric device 100. The liquid jet head 200 is used for an inkjet printer or the like.

As the substrate 2, a (110)-oriented silicon substrate may be used, for example. As shown in FIG. 2, an opening (pressure generation chamber of liquid jet head) 20 may be formed in the substrate 2, for example. Specifically, the substrate 2 may include a pressure generation chamber 20, for example.

In the liquid jet head 200, the substrate 2 is formed on a nozzle plate 22, for example. The nozzle plate 22 includes an opening (nozzle hole) 24. The nozzle hole 24 may communicate with the pressure generation chamber 20.

The elastic section 3 is formed on the substrate 2. The elastic section 3 may include a first insulating layer 30 and a second insulating layer 32 formed on the first insulating layer 30, for example. The first insulating layer 30 may be formed of silicon dioxide, for example. The second insulating layer 32 may be formed of zirconium oxide, for example. The thickness of the elastic section 3 is about 1 micrometer, for example.

An adhesive layer 40 is formed on the elastic section 3. The adhesive layer 40 may be formed of titanium (Ti) or the like. The adhesive layer 40 can significantly improve the adhesion between the elastic section 3 and the lower electrode 4.

The lower electrode 4 is formed on the adhesive layer 40. The lower electrode 4 is one of electrodes for applying a voltage to the piezoelectric layer 6. As the lower electrode 4, a film obtained by staking platinum (Pt) and iridium (Ir) in that order may be used, for example. The thickness of the lower electrode 4 is about 150 nm, for example.

A buffer layer 42 is formed on the lower electrode 4. The buffer layer 42 may be formed of titanium (Ti) or the like. The thickness of the buffer layer 42 is about 2 to 10 nm, for example. The buffer layer 42 may have a function of controlling the crystal orientation of the piezoelectric layer 6.

The piezoelectric layer 6 is formed on the buffer layer 42. The piezoelectric layer 6 is formed of lead zirconate titanate ($Pb(Zr,Ti)O_3$: PZT). The half-width of the peak of the (100) plane of the PZT according to this embodiment when subjected to measurement using an X-ray diffraction rocking curve method is 10 degrees or more and 25 degrees or less, and preferably 19 degrees or more and 21 degrees or less. The sum of the degree of (110) orientation and the degree of (111) orientation of the PZT according to this embodiment when subjected to measurement using an X-ray diffraction theta-2 theta method is 3% or more and 50% or less. These results have been confirmed by the experimental example described later. When the reflection intensity of the (XYZ) plane of the PZT in the measurement using the X-ray diffraction theta-2 theta method is I(XYZ), the degree of (XYZ) plane orientation is expressed by the following expression.

$$I(XYZ)/\{(100)+I(110)+I(111)\}$$

The degree of (100) orientation of the PZT according to this embodiment when subjected to measurement using the X-ray diffraction theta-2 theta method is 50% or more and 97% or less. The thickness of the piezoelectric layer 6 is about 1 micrometer, for example.

The upper electrode 7 is formed on the piezoelectric layer 6. The upper electrode 7 is the other electrode for applying a voltage to the piezoelectric layer 6. The upper electrode 7 may be formed of iridium (Ir), platinum (Pt), or the like. The thickness of the upper electrode 7 is about 50 nm, for example.

The adhesive layer 40, the lower electrode 4, the buffer layer 42, the piezoelectric layer 6, and the upper electrode 7 may be patterned, as shown in FIG. 2, to form a columnar stacked body (columnar portion) 50.

A method of manufacturing the piezoelectric device 100 and the liquid jet head 200 according to this embodiment is described below with reference to FIGS. 1 and 2.

(A) As shown in FIG. 1, the first insulating layer 30 is formed on the substrate 2. For example, the first insulating layer 30 formed of silicon dioxide may be formed by subjecting the substrate 2 to thermal oxidation in a diffusion furnace at 1100° C.

(B) The second insulating layer 32 is formed on the first insulating layer 30. For example, the second insulating layer 32 formed of zirconium oxide may be formed by forming a zirconium (Zr) layer by DC sputtering, RF sputtering, or the like, and subjecting the zirconium layer to thermal oxidation in a diffusion furnace at 500° C. to 1200° C.

(C) The elastic section 3 including the first insulating layer 30 and the second insulating layer 32 may be formed on the substrate 2 by the above steps.

(D) The adhesive layer 40 is formed on the elastic section 3. For example, the adhesive layer 40 may be formed by sputtering or the like.

(E) The lower electrode 4 is formed on the adhesive layer 40. The lower electrode 4 may be formed by sputtering or the like.

If necessary, the lower electrode 4 and the adhesive layer 40 may be patterned in a specific shape. The lower electrode 4 and the adhesive layer 40 may be patterned after forming a first piezoelectric layer described later.

(F) The buffer layer 42 is formed on the lower electrode 4. The buffer layer 42 may be formed by sputtering or the like.

(G) The piezoelectric layer 6 is formed on the buffer layer 42. The piezoelectric layer 6 may be formed of PZT by a sol-gel method, metal organic decomposition (MOD), or the like. The details are as follows.

A solution prepared by dissolving organometallic compounds respectively containing Pb, Zr, and Ti in a solvent is applied to the entire upper surface of the substrate 2 by spin coating or the like. For example, the composition ratio (Zr:Ti) of Zr to Ti may be adjusted by changing the mixing ratio of the organometallic compounds respectively containing Zr and Ti in the solution. For example, the organometallic compounds may be mixed so that the Ti composition (=Ti/(Zr+Ti)) is 0.4 or more and 0.6 or less.

The composition of Pb may also be adjusted by changing the mixing ratio of the organometallic compounds.

A heat treatment (drying step, degreasing step, and firing step) is then performed to form the piezoelectric layer 6. The temperature of the drying step is preferably 150° C. or more and 200° C. or less, and more preferably about 180° C., for example. The drying step is preferably performed for 5 minutes or more, and more preferably about 10 minutes, for example. In the degreasing step, organic components remaining in the PZT precursor layer subjected to the drying step may be thermally decomposed into $NO_2$, $CO_2$, $H_2O$, and the like to remove the components. The temperature of the degreasing step is preferably about 300° C., for example. In the firing step, the PZT precursor layer may be crystallized by heating. The temperature of the firing step is 600° C. to 700° C., for example. The firing step is preferably performed for 5 minutes or more and 30 minutes or less, for example. A device used for the firing step is not particularly limited. For example, a diffusion furnace, a rapid thermal annealing (RTA) device, or the like may be used.

For example, when forming the piezoelectric layer 6 with a thickness of about 1 micrometer, the crystallinity and the density of the resulting piezoelectric layer 6 can be increased by forming the piezoelectric layer 6 in several stages rather than forming the entire piezoelectric layer 6 at one time. Specifically, a first piezoelectric layer with a thickness of about 200 nm is formed on the buffer layer 42. The first piezoelectric layer, the buffer layer 42, the lower electrode 4, and the adhesive layer 40 are collectively patterned in a specific shape. A plurality of piezoelectric layers are then formed on the first piezoelectric layer. Specifically, the piezoelectric material application step, the drying step, and the degreasing step may be repeatedly performed three times, and the three layers may be collectively fired. The total thickness of the three piezoelectric layers formed on the first piezoelectric layer is about 800 nm, for example. A piezoelectric layer 6 including a plurality of piezoelectric layers and having a thickness of about 1 micrometer may be formed in this manner.

(H) The upper electrode 7 is formed on the piezoelectric layer 6. The upper electrode 7 may be formed by sputtering, for example.

The upper electrode 7 may be patterned in a desired shape. In this case, the piezoelectric layer 6 and the buffer layer 42 formed under the upper electrode 7 may be patterned together with the upper electrode 7.

(I) The piezoelectric layer 6 may be subjected to measurement by the X-ray diffraction rocking curve method, and a piezoelectric layer 6 of which the half-width of the peak of the (100) plane of the PZT forming the piezoelectric layer 6 is 10 degrees or more and 25 degrees or less (preferably 19 degrees or more and 21 degrees or less) may be determined to be a nondefective product. This step may be performed after a step of bonding the substrate 2 and the nozzle plate 22 described later.

(J) The piezoelectric layer 6 may be subjected to measurement by the X-ray diffraction theta-2 theta method, and a piezoelectric layer 6 of which the sum of the degree of (110) orientation and the degree of (111) orientation of the PZT forming the piezoelectric layer 6 is 3% or more and 50% or less may be determined to be a nondefective product. This step may be performed after the step of bonding the substrate 2 and the nozzle plate 22 described later.

(K) The piezoelectric device 100 according to this embodiment may be produced by the above steps.

(L) The thickness of the substrate 2 is reduced by polishing the back surface (side opposite to the elastic section 3) of the substrate 2. As shown in FIG. 2, the substrate 2 is patterned and wet-etched to form the opening (pressure generation chamber) 20 in the substrate 2.

As shown in FIG. 2, the nozzle plate 22 is bonded to a desired position of the back surface of the substrate 2 so that the pressure generation chamber 20 communicates with the nozzle hole 24.

(M) The liquid jet head 200 according to this embodiment may be produced by the above steps.

An experimental example is described below.

In this experimental example, six experimental samples of the piezoelectric device 100 were formed using the above manufacturing method. In samples Nos. 1 to 4, the composition ratio of each element of PZT forming the piezoelectric layer 6 was Pb:Zr:Ti=1.18:0.516:0.484. In samples Nos. 5 and 6, the composition ratio of each element of PZT forming the piezoelectric layer 6 was Pb:Zr:Ti=1.18:0.50:0.50. In this experimental example, the thickness of the buffer layer 42 was 4 nm, and the thickness of the piezoelectric layer 6 was 1.1 micrometers.

The (100) plane of the PZT forming the piezoelectric layer 6 of the experiment sample was subjected to measurement by the X-ray diffraction rocking curve method. Table 1 shows the half-width of the peak of the (100) plane of the PZT. As shown in Table 1, the half-width of the peak of each sample (Nos. 1 to 6) was 10 degrees or more and 25 degrees or less (19 degrees or more and 21 degrees or less in more detail). In this experimental example, the half-width of the peak of the (100) plane of the PZT could be adjusted to 10 degrees or more and 25 degrees or less (19 degrees or more and 21 degrees or less in more detail) because the second insulating layer 32 with a high surface roughness was used. In this experimental example, zirconium oxide (zirconia) with a surface roughness Ra of about 2.0 nm was used as the second insulating layer 32. The half-width of the piezoelectric layer 6 can be controlled by adjusting the surface roughness Ra of the second insulating layer 32. The surface roughness Ra is measured using an atomic force microscope (AFM), for example.

TABLE 1

| No. | Half-width (degree) (rocking curve) | Degree of (100) orientation (%) | Degree of (110) orientation (%) | Degree of (111) orientation (%) | Degree of (110) + (111) orientation (%) | $d_{31}$ (pC/N) |
|---|---|---|---|---|---|---|
| 1 | 19.7 | 84 | 12 | 4 | 16 | 158 |
| 2 | 20.1 | 57 | 7 | 36 | 43 | 151 |
| 3 | 20.3 | 94 | 3 | 3 | 6 | 150 |
| 4 | 20.8 | 73 | 22 | 5 | 27 | 153 |
| 5 | 20.3 | 81 | 15 | 4 | 19 | 172 |
| 6 | 20.4 | 96 | 1 | 3 | 4 | 180 |

The piezoelectric layer 6 of the experimental sample was subjected to measurement by the X-ray diffraction theta-2 theta method. Table 1 shows the calculation results of the degree of (100) orientation, the degree of (110) orientation, and the degree of (111) orientation of the PZT forming the piezoelectric layer 6. As shown in Table 1, the sum of the degree of (110) orientation and the degree of (111) orientation of each sample (Nos. 1 to 6) was 3% or more and 50% or less.

A liquid jet head 200 having the experiment sample of the piezoelectric device 100 was formed using the above manufacturing method, and the amount of displacement of the elastic section 3 was measured. The piezoelectric constant $d_{31}$ was calculated from the resulting amount of displacement by simulation using a finite element method. The results are shown in Table 1. Although the sum of the degree of (110) orientation and the degree of (111) orientation of each sample was in a wide range of 3% or more and 50% or less (i.e. the degree of (100) orientation was 50% or more 97% or less), the piezoelectric constant $d_{31}$ was almost uniform, as shown in Table 1. It is considered that the piezoelectric constants $d_{31}$ of the samples Nos. 5 and 6 were increased because the samples Nos. 5 and 6 had a composition ratio of each element of the PZT differing from those of the samples Nos. 1 to 4.

As shown in Table 1, equal piezoelectric characteristics were obtained in spite of different PZT crystal orientations. This is considered to be because the half-width of the peak of the (100) plane determined by the rocking curve measurement was 10 degrees or more and 25 degrees or less (19 degrees or more and 21 degrees or less in more detail) (i.e. unstable crystal state). Since the (100)-oriented crystal at an angle with the normal direction of the substrate 2 may become close to the (110)-oriented crystal or the (111)-oriented crystal, piezoelectric characteristics decrease in comparison with the (100)-oriented crystal which does not form an angle with the normal direction of the substrate 2. Since the (110)-oriented crystal or the (111)-oriented crystal at an angle with the normal direction of the substrate 2 may become close to the (100)-oriented crystal, the piezoelectric characteristics increase in comparison with the (110)-oriented crystal or the (111)-oriented crystal which does not form an angle with the normal direction of the substrate 2. Therefore, it is considered that the difference in piezoelectric characteristics due to the crystal orientation is reduced by the presence of the crystal of which the plane orientation forms an angle with the normal direction of the substrate 2 to some extent (e.g. 10 degrees or less).

In this embodiment, the half-width of the peak of the (100) plane of the PZT measured by the X-ray diffraction rocking curve method is 10 degrees or more and 25 degrees or less (preferably 19 degrees or more and 21 degrees or less). This suppresses the effects on piezoelectric characteristics due to a variation in crystal orientation of PZT accompanying a change in environment and process conditions. This has been confirmed by the above experimental example. Therefore, this embodiment can provide a piezoelectric device and a liquid jet head having uniform piezoelectric characteristics and high reliability.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

For example, the piezoelectric device according to the above embodiment of the invention may be applied to an actuator, a gyroelement such as a gyrosensor, a film bulk acoustic resonator (FBAR) type and solid mounted resonator (SMR) type bulk acoustic wave (BAW) filter, an ultrasonic motor, and the like. The piezoelectric device according to the embodiment of the invention may be applied to various applications due to high reliability.

What is claimed is:

1. A piezoelectric device comprising:
a substrate;
a lower electrode formed over the substrate;
a piezoelectric layer formed over the lower electrode and including lead zirconate titanate; and
an upper electrode formed over the piezoelectric layer,
the lead zirconate titanate having a half-width of a peak of a (100) plane measured by an X-ray diffraction rocking curve method of 10 degrees or more and 25 degrees or less.

2. The piezoelectric device as defined in claim 1, wherein the half-width is 19 degrees or more and 21 degrees or less.

3. The piezoelectric device as defined in claim 1,
wherein a sum of a degree of (110) orientation and a degree of (111) orientation of the lead zirconate titanate measured by an X-ray diffraction theta-2 theta method is 3% or more and 50% or less.

4. The piezoelectric device as defined in claim 1,
wherein the half-width is 19 degrees or more and 21 degrees or less; and
wherein a sum of a degree of (110) orientation and a degree of (111) orientation of the lead zirconate titanate measured by an X-ray diffraction theta-2 theta method is 3% ore more and 50% or less.

5. A liquid head comprising:
a nozzle plate having a nozzle hole;
a substrate formed over the nozzle plate and having a pressure generation chamber which communicates with the nozzle hole;
an elastic section formed over the substrate;
a lower electrode formed over the elastic section;
a piezoelectric layer formed over the lower electrode and including lead zirconate titanate; and
an upper electrode formed over the piezoelectric layer,
the lead zirconate titanate having a half-width of a peak of a (100) plane measured by an X-ray diffraction rocking curve method of 10 degrees or more and 25 degrees or less.

* * * * *